United States Patent
Lee et al.

(10) Patent No.: US 7,292,469 B2
(45) Date of Patent: Nov. 6, 2007

(54) METHODS OF PROGRAMMING NON-VOLATILE MEMORY DEVICES INCLUDING TRANSITION METAL OXIDE LAYER AS DATA STORAGE MATERIAL LAYER AND DEVICES SO OPERATED

(75) Inventors: Moon-Sook Lee, Seoul (KR); In-Gyu Baek, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 76 days.

(21) Appl. No.: 11/282,136

(22) Filed: Nov. 18, 2005

(65) Prior Publication Data
US 2006/0108625 A1    May 25, 2006

(30) Foreign Application Priority Data
Nov. 23, 2004    (KR) ............... 10-2004-0096609

(51) Int. Cl.
*G11C 11/00*    (2006.01)
(52) U.S. Cl. .................. 365/163; 365/100; 365/148
(58) Field of Classification Search ................ 365/163
See application file for complete search history.

(56) References Cited

U.S. PATENT DOCUMENTS

| | | | |
|---|---|---|---|
| 6,487,113 B1 | 11/2002 | Park et al. | 365/163 |
| 6,673,691 B2 | 1/2004 | Zhuang et al. | 438/382 |
| 6,759,249 B2 | 7/2004 | Zhuang et al. | 438/3 |
| 2004/0114444 A1 | 6/2004 | Matsuoka | 365/200 |
| 2004/0245557 A1* | 12/2004 | Seo et al. | 257/298 |
| 2005/0151277 A1* | 7/2005 | Kawazoe et al. | 257/904 |
| 2005/0153504 A1* | 7/2005 | Kawazoe et al. | 438/222 |
| 2005/0247921 A1* | 11/2005 | Lee et al. | 257/2 |
| 2005/0260839 A1* | 11/2005 | Allenspach et al. | 438/584 |
| 2006/0023497 A1* | 2/2006 | Kawazoe et al. | 365/158 |
| 2006/0152961 A1* | 7/2006 | Kim et al. | 365/148 |

\* cited by examiner

*Primary Examiner*—Son L. Mai
(74) *Attorney, Agent, or Firm*—Myers, Bigel, Sibley & Sajovec, P.A.

(57) ABSTRACT

A method of programming a non-volatile memory device including a transition metal oxide layer includes applying a first electric pulse to the transition metal oxide layer for a first period to reduce a resistance of the transition metal oxide layer and applying a second electric pulse to the transition metal oxide layer for a second period, longer than the first period, to increase the resistance of the transition metal oxide layer. Related devices are also disclosed.

31 Claims, 2 Drawing Sheets

METHODS OF PROGRAMMING NON-VOLATILE MEMORY DEVICES INCLUDING TRANSITION METAL OXIDE LAYER AS DATA STORAGE MATERIAL LAYER AND DEVICES SO OPERATED

CROSS-REFERENCE TO RELATED APPLICATION

This application claims priority from Korean Patent Application No. 2004-0096609, filed Nov. 23, 2004, the disclosure of which is hereby incorporated herein by reference in its entirety as if set forth fully herein.

FIELD OF THE INVENTION

The present invention relates to semiconductor devices, and more particularly, to methods of programming non-volatile memory devices including a transition metal oxide layer as a data storage material layer and devices so programmed.

BACKGROUND

As is well known, non-volatile memory devices are characterized in that there is no loss of data stored in their memory cells even when an external power supply is removed. For that reason, such non-volatile memory devices are widely employed in a computer, a mobile communication system, a memory card, and the like.

A flash memory device is widely used for the non-volatile memory devices. The flash memory device mostly employs memory cells having a stacked gate structure. The stacked gate structure includes a tunnel oxide layer, a floating gate, an inter-gate dielectric layer, and a control gate electrode, which are sequentially stacked on a channel region. In order to enhance a reliability and a program efficiency of the flash memory cell, a film quality of the tunnel oxide layer should be improved, and a coupling ratio of the cell increased.

Studies on new non-volatile memory devices have been actively made instead of the flash memory devices. A non-volatile memory device, which employs a material having reversibly-varying resistances by applied electric pulses for a data storage material layer, may be advantageous to high integration unlike a capacitor memory device in which memory characteristics are proportional to the size of a cell area. One such non-volatile memory device is a phase change memory device employing a phase change material layer which is reversibly changed between an amorphous state and a crystalline structure by applied electric pulses.

A resistance random access memory (RRAM) device has also been recently introduced, in which a variable resistive material layer is used as a data storage material layer. The variable resistive material layer is a material layer characterized to show reversible resistance variance in accordance with a polarity and/or an amplitude of an applied electric pulse, and a colossal magnetro-resistive material layer (CMR material layer) having a perovskite structure, for example, $PrCaMnO_3$ (PCMO) layer is normally used. However, it may be difficult to apply the PCMO layer to real products since it is difficult to form the PCMO layer on the overall surface of a wafer with a uniform crystalline structure and furthermore, it can be difficult to pattern the PCMO layer by typical photolithography and etch processes normally used in the semiconductor fabrication processes. In the meantime, a transition metal oxide layer is studied as a replaceable material instead of the PCMO layer because the transition metal oxide layer may be more easily deposited and patterned in the typical semiconductor fabrication processes.

In the case of using a phase change material layer or variable resistive material layer as a data storage material layer, an optimized programming method may be used in accordance with the materials or switching mechanism employed. For example, a method of programming a phase change memory device is discussed in U.S. Pat. No. 6,487,113. Further, a method of programming a RRAM device employing the PCMO layer as a data storage material layer is discussed in U.S. Pat. No. 6,673,691. However, such programming methods may not be employed in the same way in the RRAM device employing the transition metal oxide layer as a data storage material layer.

SUMMARY

Embodiments according to the invention can provide methods of programming non-volatile memory devices including transition metal oxide layer as data storage material layer and devices so operated. Pursuant to these embodiments, a method of programming a non-volatile memory device including a transition metal oxide layer includes applying a first electric pulse to the transition metal oxide layer for a first period to reduce a resistance of the transition metal oxide layer and applying a second electric pulse to the transition metal oxide layer for a second period, longer than the first period, to increase the resistance of the transition metal oxide layer.

In some embodiments according to the invention, applying the first electric pulse includes applying the first electric pulse to the transition metal oxide layer for a first period comprising about 1 ns to about 100 ns. In some embodiments according to the invention, applying a first electric pulse includes applying the first electric pulse to the transition metal oxide layer for a first period comprising about 1 ns to about 10 ns. In some embodiments according to the invention, the method further includes applying at least a third electric pulse after the second electric pulse to the transition metal oxide layer for a third period, longer than the first period, to increase the resistance of the transition metal oxide layer.

In some embodiments according to the invention, applying a second electric pulse includes applying a single electric pulse for about 1 µs to about 100 µs. In some embodiments according to the invention, applying a second electric pulse includes applying a single electric pulse for about 1 µs to about 10 µs. In some embodiments according to the invention, wherein the second and third periods are about 10 ns to about 1000 ns each.

In some embodiments according to the invention, the second and third periods are about 50 ns to about 100 ns each. In some embodiments according to the invention, applying a second electric pulse includes applying a voltage of about 0.1 V to about 10.0 V. In some embodiments according to the invention, applying a second electric pulse includes applying a voltage of about 0.1 V to about 3.0 V.

In some embodiments according to the invention, applying a first electric pulse includes applying a voltage having an amplitude of about 1.5 to 2.5 times that of an amplitude of the second electric pulse. In some embodiments according to the invention, applying a first electric pulse includes applying a voltage of about 0.15 V to about 7.5 V for about 1 ns to about 10 ns. In some embodiments according to the invention, applying a second electric pulse includes applying a voltage of about 0.1 V to about 3.0 V for about 1 µs to about 10 µs.

In some embodiments according to the invention, applying a second electric pulse includes applying a first voltage of about 0.1 V to about 3.0 V for about 50 ns to 100 ns and applying a third electric pulse includes applying a second voltage of about 0.1 V to about 3.0 V for about 50 ns to 100 ns. In some embodiments according to the invention, the transition metal oxide layer is a material according to a chemical formula, $M_xO_y$, the characters of the chemical formula, "M", "O", "x", and "y" are transition metal, oxygen, transition metal composition, and oxygen composition respectively, and the transition metal comprises nickel, niobium, titanium, zirconium, hafnium, cobalt, iron, copper, and/or chrome.

In some embodiments according to the invention, a resistance RAM (RRAM) device that includes an insulating layer on a semiconductor substrate, a lower electrode and an upper electrode on the insulating layer, and a transition metal oxide layer between the lower electrode and the upper electrode, can be programmed by varying periods of pulses applied to the transition metal oxide layer to change a resistance of the transition metal oxide layer.

In further embodiments according to the invention, a resistance RAM (RRAM) device includes an insulating layer on a semiconductor substrate, a lower electrode on the insulating layer, and an upper electrode on the lower electrode. A transition metal oxide layer is located between the lower electrode and the upper electrode. The transition metal oxide layer is configured to provide relatively high resistance responsive to a first electric pulse applied to the transition metal oxide layer for a first period and to provide a relatively low resistance responsive to a second electric pulse applied to the transition metal oxide layer for a second period, longer than the first period.

DESCRIPTION OF EMBODIMENTS ACCORDING TO THE INVENTION

Figure 1:
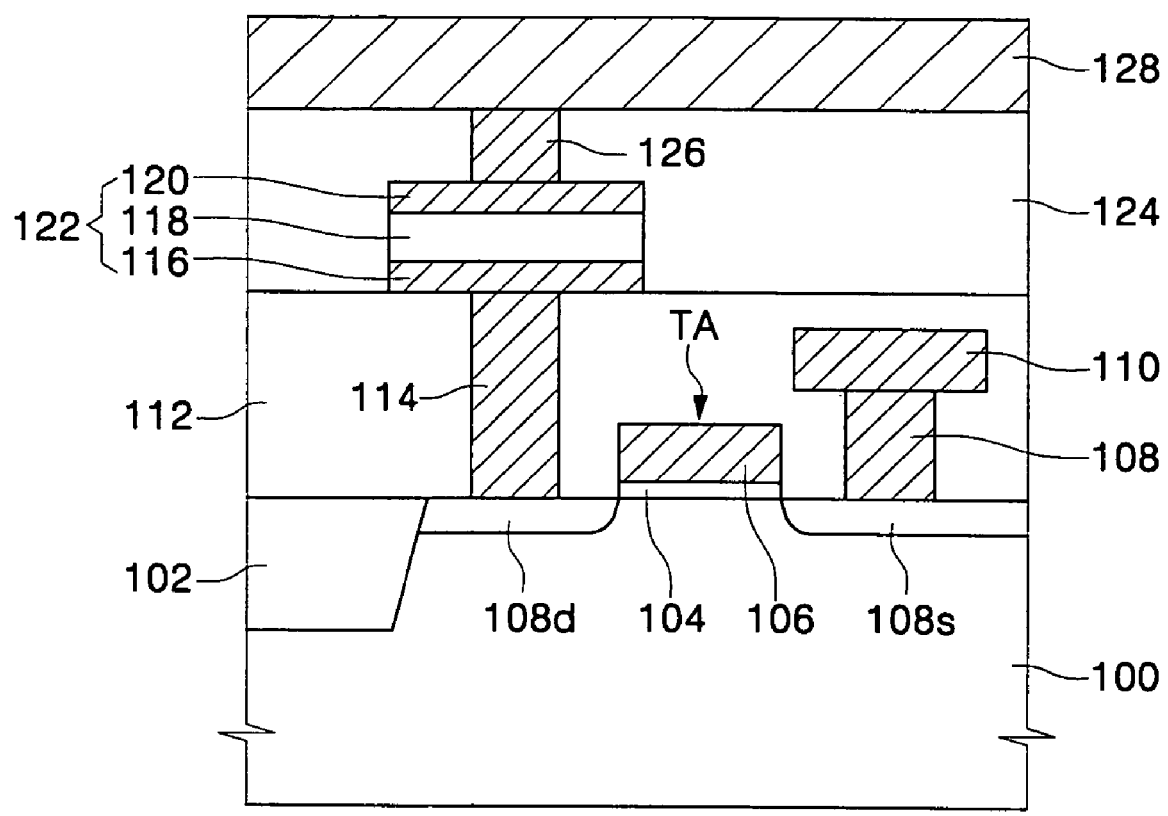
FIG. 1 is a sectional view illustrating a unit cell of a RRAM (resistance random access memory) device suitable to employing a programming method according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a sectional view illustrating a unit cell of a RRAM (resistance random access memory) device suitable for employing a programming method according to an embodiment of the present invention.

Referring to FIG. 1, an isolation layer 102 is formed in a predetermined region of a semiconductor substrate 100 to define an active region. A drain region 108d and a source region 108s are provided in the active region spaced-apart from each other. A gate electrode 106 is disposed to cross over the active region between the drain region 108d and the source region 108s. The gate electrode 106 may extend to function as word lines. The gate electrode 106 is insulated from the active region by a gate insulating layer 104. In this case, the gate electrode 106, the drain region 108d and the source region 108s constitute an access transistor TA.

The access transistor TA and the isolation layer 102 are covered with an insulating layer 112. The insulating layer 112 may be a silicon oxide layer, a silicon nitride layer, or a combination layer thereof. The source region 108s is electrically connected to a source line 110 inside the insulating layer 112 through a source contact plug 108. The source line 110 may be disposed to be in parallel with the gate electrode 106. The drain region 108d is electrically connected to a node contact plug 114 penetrating the insulating layer 112.

A data storage element 122 is provided on the insulating layer 112. The data storage element 122 is disposed to cover the node contact plug 114. The data storage element 122 may include a lower electrode 116, a transition metal oxide layer 118, and an upper electrode 120, which are sequentially stacked.

The lower electrode 116 and the upper electrode 120 are preferably oxidation resistant metal layers. For example, the lower electrode 116 and the upper electrode 120 may be an iridium (Ir) layer, a platinum (Pt) layer, an iridium oxide (IrO) layer, a titanium nitride (TiN) layer, a titanium aluminum nitride (TiAlN) layer, a ruthenium (Ru) layer, or a ruthenium oxide (RuO) layer. Alternatively, the lower electrode 116 and the upper electrode 120 may be polysilicon layers.

The transition metal oxide layer 118 may be represented by a chemical formula, $M_xO_y$. In the chemical formula, "M", "O", "x", and "y" represent transition metal, oxygen, transition metal composition, and oxygen composition respectively. In this case, the transition metal may be nickel, niobium, titanium, zirconium, hafnium, cobalt, iron, copper, or chrome.

The data storage element 122 and the insulating layer 112 may be covered with a metal interlayer insulating layer 124. The metal interlayer insulating layer 124 may be a silicon oxide layer. A bit line 128 may be provided on the metal interlayer insulating layer 124. The bit line 128 is electrically connected to the upper electrode 120 through bit line contact plugs 126 penetrating the metal interlayer insulating layer 124. The bit line 128 may be disposed to run across over the gate electrode 106.

As described above, the unit cell of the RRAM device may include one transistor and one data storage element. However, the programming method of the RRAM device according to some embodiments of the present invention is not limited to this application of the structure, but the present invention can be employed to various structures, such as a RRAM using a transition metal oxide layer as a data storage material layer. For example, the programming method of the RRAM device can be employed to a RRAM device having a cross point array as disclosed, for example, in U.S. Patent Application No. 2004/0108528, the contents of which is incorporated herein by reference.

Hereinafter, a method of programming a RRAM device according to an embodiment of the present invention will be explained. In some method embodiments of programming a RRAM device according to the invention, a width of the electric pulse applied between the lower electrode 116 and the upper electrode 120 to increase a resistance of the transition metal oxide layer 118, that is, to reset the RRAM device (hereinafter, referred to as "reset pulse") is greater than a width of the electric pulse applied between the lower electrode 116 and the upper electrode 120 to reduce a resistance of the transition metal oxide layer 118, that is, set the RRAM device (hereinafter, referred to as "set pulse"). The term "electric pulse width" refers to a time period during which the electric pulse is applied to the transition metal oxide layer to affect the desired change in resistance. The set pulse can be applied for a period of nanosecond (ns) unit, and the reset pulse can be applied for a period of nanosecond or microsecond (µs) unit. In this case, a length of the reset pulse may be about 100 to 1000 times a length of the set pulse.

In some embodiments according to the present invention, the set pulse may be applied for a period of about 1 to 100 ns as a single pulse so as to reduce a resistance of the transition metal oxide layer 118. The transition metal oxide layer 118 is switched to a set state having a low resistance by the set pulse. In some embodiments according to the present invention, the set pulse is applied for a period of about 1 to 10 ns. In this case, the set pulse may be a voltage pulse having an amplitude of 1.5 to 2.5 times the amplitude of a reset pulse as discussed hereinbelow in greater detail.

The reset pulse may be a single pulse or a multiple pulse composed of at least two electric pulses. In the case that the reset pulse is a single pulse, the reset pulse is applied for a period of about 1 to 100 µs, preferably for a period of about 1 to 10 µs, so as to increase a resistance of the transition metal oxide layer 118. The transition metal oxide layer 118 is switched to a reset state having a higher resistance than that of the set state by the reset pulse. In the case that the reset pulse is a multiple pulse, each electric pulse constituting the multiple pulse may be applied for a period of about 10 to 1000 ns, preferably for a period of about 50 to 100 µs. In this case, the reset pulse may be a voltage pulse being in a range of about 0.1 to 10 V, preferably about 0.1 to 3 V. Therefore, the set pulse may be a voltage pulse being in a range of about 0.15 to 25 V, preferably about 0.15 to 7.5 V.

It will be understood that in some embodiments according to the invention, that although some of the examples disclosed herein describe a specific number of electric pulses being applied, the resistance of the transition metal oxide layer 118 can be changed to the reset state by applying any sufficient number of electric pulses of sufficient period and amplitude to affect the desired change. Furthermore, the period and amplitude of the applied electric pulses can be different or the same.

Figure 2:
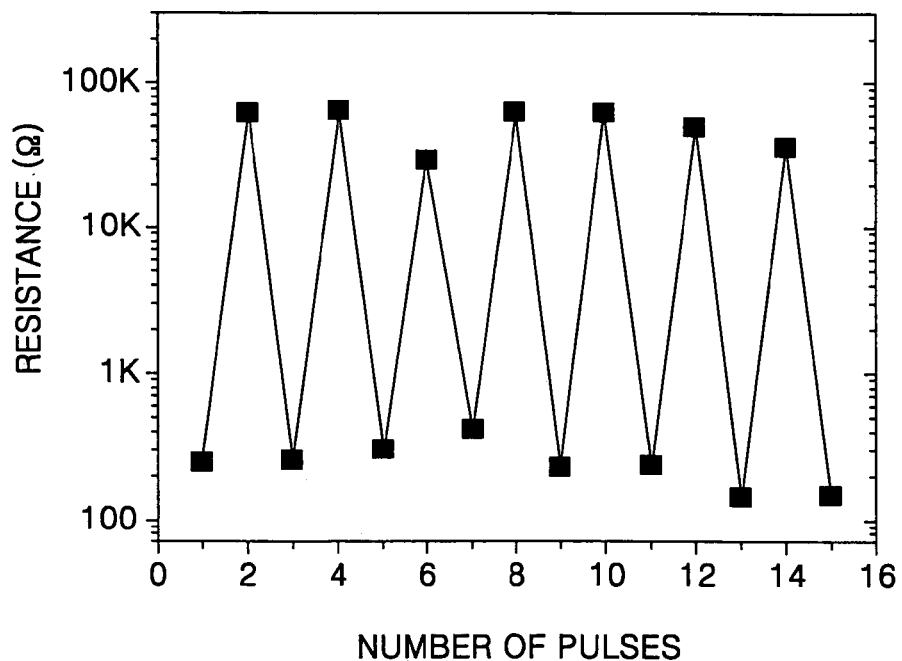
FIGS. 2 and 3 are graphs illustrating resistance switching of a transition metal oxide layer in accordance with electric pulses.
Figure 3:
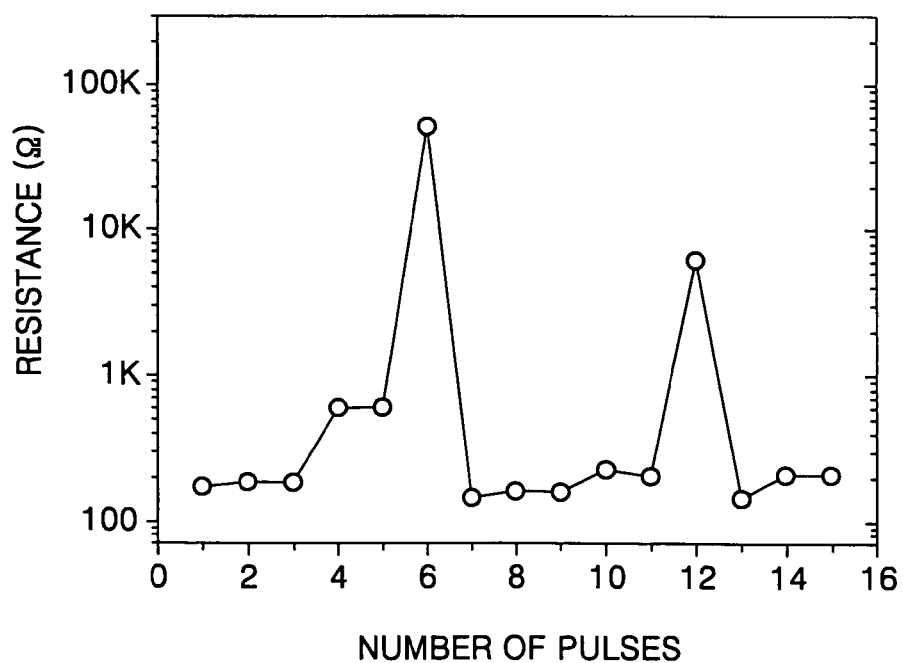

FIGS. 2 and 3 are graphs illustrating resistance switching of a transition metal oxide layer in accordance with electric pulses. FIGS. 2 and 3 illustrate results of experiments with the data storage element fabricated as explained in reference to FIG. 1. In this experiment, the transition metal oxide layer was formed of a nickel oxide layer. The nickel oxide layer was formed by depositing a nickel layer using a sputtering process and performing a oxygen plasma treatment on the deposited nickel layer, and repeating the processes until forming the nickel oxide layer with a thickness of 200 Å. A lower electrode and an upper electrode were respectively formed with a thickness of 500 Å using iridium. Further, the data storage element was formed with a rectangular shape of $0.3\times0.7$ µm² from the planar view.

In FIG. 2, a set pulse having an amplitude of 0.7 V and a width of 10 ns was applied between the upper electrode and the lower electrode in order to reduce a resistance of the nickel oxide layer. In order to increase a resistance of the nickel oxide layer, a reset pulse having an amplitude of 1.1 V and a width of 5 µs was applied between the upper electrode and the lower electrode. As depicted in FIG. 2, the nickel oxide layer showed a reversible resistance switching from a hundreds of ohm (Ω) set state to a tens of thousands of ohm (Ω) reset state with a sufficiently wide margin.

In FIG. 3, while a set pulse having an amplitude of 0.7 V and a width of 10 ns was applied in order to reduce a resistance of the nickel oxide layer, a reset pulse including a plurality of electric pulses having an amplitude of 1.1 V and a width of 100 ns was applied in order to increase a resistance of the nickel oxide layer. As depicted in FIG. 3, the nickel oxide layer was switched to a set state by a single set pulse, and was switched to a reset state in the case of applying a reset pulse including five electric pulses.

The results show that, while it is enough that the set pulse to reduce a resistance of the transition metal oxide layer is a single electric pulse having a relatively narrow width (short duration), the reset pulse to increase a resistance of the transition metal oxide layer is preferably a single electric pulse or multiple electric pulse having a width greater than that of the set pulse. That is, in some embodiments according to the invention, a method of programming a RRAM memory device employing the transition metal oxide layer as a data storage material layer includes applying a relatively narrow width of a pulse for set, and applying a relatively large width of a pulse for reset.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. A method of programming a non-volatile memory device including a transition metal oxide layer, the method comprising:
   applying a first electric pulse to the transition metal oxide layer for a first period to reduce a resistance of the transition metal oxide layer; and
   applying a second electric pulse to the transition metal oxide layer for a second period, longer than the first period, to increase the resistance of the transition metal oxide layer.

2. The method according to claim 1, wherein applying a first electric pulse comprises applying the first electric pulse to the transition metal oxide layer for a first period of about 1 ns to about 100 ns.

3. The method according to claim 1, wherein applying a first electric pulse comprises applying the first electric pulse to the transition metal oxide layer for a first period of about 1 ns to about 10 ns.

4. The method according to claim 1 further comprising:
   applying at least a third electric pulse after the second electric pulse to the transition metal oxide layer for a third period, longer than the first period, to increase the resistance of the transition metal oxide layer.

5. The method according to claim 1, wherein applying a second electric pulse comprises applying a single electric pulse for about 1 µs to about 100 µs.

6. The method according to claim 1, wherein applying a second electric pulse comprises applying a single electric pulse for about 1 µs to about 10 µs.

7. The method according to claim 4, wherein the second and third periods are about 10 ns to about 1000 ns each.

8. The method according to claim 4, wherein the second and third periods are about 50 ns to about 100 ns each.

9. The method according to claim 1, wherein applying a second electric pulse comprises applying a voltage of about 0.1 V to about 10.0 V.

10. The method according to claim 1, wherein applying a second electric pulse comprises applying a voltage of about 0.1 V to about 3.0 V.

11. The method according to claim 9, wherein applying a first electric pulse comprises applying a voltage that is about 1.5 to about 2.5 times greater than the voltage of the second electric pulse.

12. The method according to claim 1, wherein applying a first electric pulse comprises applying a voltage of about 0.15 V to about 7.5 V for about 1 ns to about 10 ns.

13. The method according to claim 1, wherein applying a second electric pulse comprises applying a voltage of about 0.1 V to about 3.0 V for about 1 µs to about 10 µs.

14. The method according to claim 4, wherein:
   applying a second electric pulse comprises applying a first voltage of about 0.1 V to about 3.0 V for about 50 ns to 100 ns; and
   applying a third electric pulse comprises applying a second voltage of about 0.1 V to about 3.0 V for about 50 ns to 100 ns.

15. The method according to claim 1, wherein the transition metal oxide layer comprises a material having a chemical formula, $M_xO_y$, where "M" is a transition metal comprising nickel, niobium, titanium, zirconium, hafnium, cobalt, iron, copper, and/or chrome.

16. A method of programming a resistance RAM (RRAM) device comprising an insulating layer on a semiconductor substrate, a lower electrode and an upper electrode on the insulating layer, and a transition metal oxide layer between the lower electrode and the upper electrode, the method comprising:
   varying periods of pulses applied to the transition metal oxide layer to change a resistance of the transition metal oxide layer.

17. The method according to claim 16, wherein varying comprises:
   applying a first electric pulse to the transition metal oxide layer for a first period to reduce a resistance of the transition metal oxide layer; and
   applying a second electric pulse to the transition metal oxide layer for a second period, longer than the first period, to increase a resistance of the transition metal oxide layer.

18. The method according to claim 17, wherein applying a first electric pulse comprises applying the first electric pulse to the transition metal oxide layer for a first period of about 1 ns to about 100 ns.

19. The method according to claim 17, wherein applying a first electric pulse comprises applying the first electric pulse to the transition metal oxide layer for a first period of about 1 ns to about 10 ns.

20. The method according to claim 17 further comprising:
   applying at least a third electric pulse after the second electric pulse to the transition metal oxide layer for a third period, longer than the first period, to increase the resistance of the transition metal oxide layer.

21. The method according to claim 17, wherein applying a second electric pulse comprises applying a single electric pulse for about 1 μs to about 100 μs.

22. The method according to claim 17, wherein applying a second electric pulse comprises applying a single electric pulse for about 1 μs to about 10 μs.

23. The method according to claim 20, wherein the second and third periods are about 10 ns to about 1000 ns each.

24. The method according to claim 20, wherein the second and third periods are about 50 ns to about 100 ns each.

25. The method according to claim 17, wherein applying a second electric pulse comprises applying a voltage of about 0.1 V to about 10.0 V.

26. The method according to claim 17, wherein applying a second electric pulse comprises applying a voltage of about 0.1 V to about 3.0 V.

27. The method according to claim 25, wherein applying a first electric pulse comprises applying a voltage that is about 1.5 to about 2.5 times greater than the voltage of the second electric pulse.

28. The method according to claim 17, wherein applying a first electric pulse comprises applying a voltage of about 0.15 V to about 7.5 V for about 1 ns to about 10 ns.

29. The method according to claim 17, wherein applying a second electric pulse comprises applying a voltage of about 0.1 V to about 3.0 V for about 1 μs to about 10 μs.

30. The method according to claim 20, wherein:

applying a second electric pulse comprises applying a first voltage of about 0.1 V to about 3.0 V for about 50 ns to 100 ns; and applying a third electric pulse comprises applying a second voltage of about 0.1 V to about 3.0 V for about 50 ns to 100 ns.

31. The method according to claim 16, wherein the transition metal oxide layer comprises a material having a chemical formula, $M_xO_y$, where "M" is a transition metal comprising nickel, niobium, titanium, zirconium, hafnium, cobalt, iron, copper, and/or chrome.

* * * * *